(12) United States Patent
Lee et al.

(10) Patent No.: US 12,206,076 B2
(45) Date of Patent: Jan. 21, 2025

(54) APPARATUS FOR EVALUATING INSULATION OF SECONDARY BATTERY

(71) Applicants: HYUNDAI MOTOR COMPANY, Seoul (KR); KIA CORPORATION, Seoul (KR)

(72) Inventors: Ju Kyoung Lee, Hwaseong-si (KR); Seung Beom Yoon, Hwaseong-si (KR)

(73) Assignees: HYUNDAI MOTOR COMPANY, Seoul (KR); KIA CORPORATION, Seoul (KR)

(*) Notice: Subject to any disclaimer, the term of this patent is extended or adjusted under 35 U.S.C. 154(b) by 139 days.

(21) Appl. No.: 18/076,562

(22) Filed: Dec. 7, 2022

(65) Prior Publication Data

US 2024/0030504 A1 Jan. 25, 2024

(30) Foreign Application Priority Data

Jul. 19, 2022 (KR) .................. 10-2022-0089145

(51) Int. Cl.
| | | |
|---|---|---|
| H01M 10/42 | (2006.01) | |
| G01R 31/385 | (2019.01) | |
| G01R 31/389 | (2019.01) | |
| H01M 10/48 | (2006.01) | |
| H01M 50/119 | (2021.01) | |
| H01M 50/126 | (2021.01) | |

(52) U.S. Cl.
CPC ...... *H01M 10/4285* (2013.01); *G01R 31/385* (2019.01); *G01R 31/389* (2019.01); *H01M 10/48* (2013.01); *H01M 50/119* (2021.01); *H01M 50/126* (2021.01)

(58) Field of Classification Search
CPC .................. G01R 31/385; G01R 31/389
See application file for complete search history.

(56) References Cited

U.S. PATENT DOCUMENTS

| | | | |
|---|---|---|---|
| 7,675,293 B2 * | 3/2010 | Christophersen .... | G01R 31/367 324/613 |
| 9,917,337 B2 * | 3/2018 | Mankyu ............ | G01R 31/3865 |
| 2015/0226782 A1 | 8/2015 | Cordesses et al. | |
| 2019/0064284 A1 | 2/2019 | Christophersen et al. | |
| 2020/0249264 A1 | 8/2020 | Briano | |
| 2020/0341074 A1 | 10/2020 | Lee et al. | |
| 2021/0011092 A1 | 1/2021 | Mizoguchi | |

FOREIGN PATENT DOCUMENTS

| | | | | |
|---|---|---|---|---|
| JP | 11297367 A | * | 10/1999 | |
| JP | 2008-243439 A | | 10/2008 | |
| JP | 2012-514183 A | | 6/2012 | |
| JP | 2020-072059 A | | 5/2020 | |
| KR | 2008-0074240 A | | 8/2008 | |
| KR | 2010-0079622 A | | 7/2010 | |
| KR | 10-1021706 B1 | | 3/2011 | |
| KR | 10-2023739 B1 | | 9/2019 | |
| KR | 10-2146945 B1 | | 8/2020 | |
| KR | 2021-0090491 A | | 7/2021 | |
| WO | WO-2019209033 A1 | * | 10/2019 | ............ B60L 3/0046 |

* cited by examiner

*Primary Examiner* — Walter L Lindsay, Jr.
*Assistant Examiner* — Milton Gonzalez
(74) *Attorney, Agent, or Firm* — MCDONNELL BOEHNEN HULBERT & BERGHOFF LLP

(57) ABSTRACT

An apparatus for evaluating insulation of the secondary battery is configured to apply alternating current (AC) voltage to a cell of the secondary battery and to determine whether the corresponding cell is insulated through impedance acquired based on output signals in response to the applied AC voltage.

15 Claims, 10 Drawing Sheets

FIG. 1 ("Prior Art")
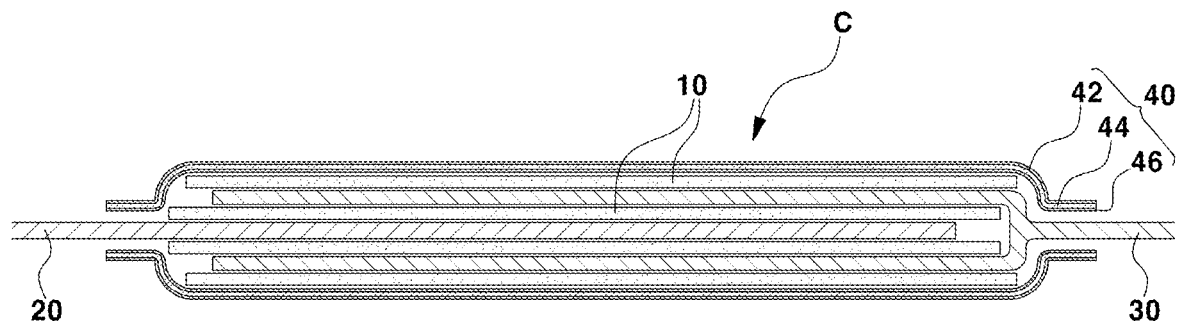
FIG. 2A ("Prior Art")
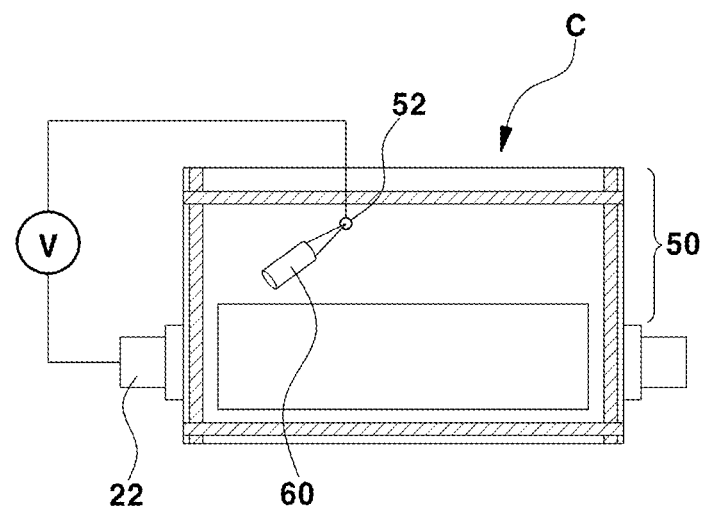
FIG. 2B ("Prior Art")
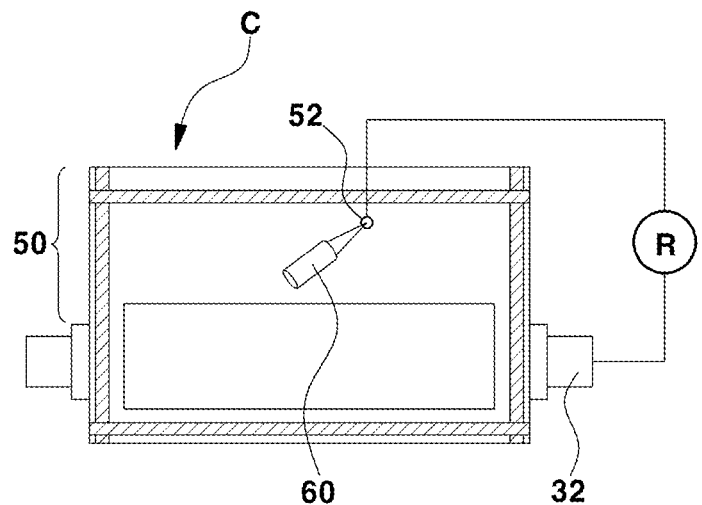

APPARATUS FOR EVALUATING INSULATION OF SECONDARY BATTERY

CROSS REFERENCE TO RELATED APPLICATIONS

This application claims under 35 U.S.C. § 119(a) the benefit of priority to Korean Patent Application No. 10-2022-0089145 filed on Jul. 19, 2022, the entire contents of which are incorporated herein by reference.

BACKGROUND

(a) Technical Field

The present disclosure relates to an apparatus for evaluating insulation of a secondary battery. More particularly, it relates to an apparatus for evaluating insulation of a battery cell.

(b) Background Art

Recently, there is rising interest in electric vehicles which are driven by a motor instead of an engine. A secondary battery, which is one of core elements of an electric vehicle, is configured to provide electric power to a motor.

The secondary battery for electric vehicles is configured such that plural unit cells are assembled into a module or a pack so as to exhibit a high voltage and a high capacity. The unit cells may be classified into a pouch type, a prismatic type, a cylindrical type, etc., depending on the type of a packing material.

For example, pouch-type cells have excellent space efficiency and high energy density, and are thus widely used. As shown in FIG. 1, a pouch-type cell C is configured such that separators 10, a positive electrode 20, and a negative electrode 30 are accommodated in a packing material 40. The cell C is sealed after a liquid electrolyte has been injected into the packing material 40. The packing material 40 of the pouch-type cell C includes an outer insulating layer 42, an aluminum layer 44 and an inner insulating layer 46.

The outer insulating layer 42 may be provided to protect the pouch-type cell C from external impact and may include polyethylene terephthalate (PET) resin. The aluminum layer 44 maintains mechanical strength and serves as a barrier against oxygen and moisture. The inner insulating layer 46 serves to seal the pouch-type cell C and may include, for example, polypropylene (PP).

During manufacture of the pouch-type cell C, the aluminum layer 44 of the packing material 40 may be damaged for various reasons. For example, formation of the packing material 40 is performed so as to form a shape for electrodes and, in this case, when the pouch-type cell C is a defective cell, the inner insulating layer 46 is melted. Otherwise, the inner insulating layer 46 may be damaged (scratched) when the pouch-type cell C is assembled by inserting the completed electrodes 20, 30 into the packing material 40, or the inner insulating layer 46 may be melted when the pouch-type cell C is sealed. There, the aluminum layer 44 is peeled off from an adhesive layer, and thereby, insulation of the packing material 40 breaks down, and short circuit between the electrodes 20, 30 and packing material 40 occurs.

When the aluminum layer 44 is exposed at the time of assembling the pouch-type cell C, the positive electrode 20 or the negative electrode 30 may come into contact with the packing material 40. When the positive electrode 20 and/or the negative electrode 30 and the packing material 40 are not insulated from each other, the aluminum layer 44 may be corroded during charging and discharging a secondary battery. Corrosion of the aluminum layer 44 may cause a short circuit and may have serious effects on safety of the secondary battery for electric vehicles in which plural cells come into contact with one another. Therefore, an insulation resistance test of pouch-type cells is performed when the pouch-type cells are manufactured.

The above information disclosed in this Background section is only for enhancement of understanding of the background of the disclosure and therefore it may contain information that does not form the prior art that is already known in this country to a person of ordinary skill in the art.

SUMMARY

The present disclosure has been made in an effort to solve the above-described problems associated with the prior art, and it is an object of the present disclosure to provide an apparatus for evaluating insulation of a secondary battery which has improved measurement reliability.

In one aspect, the present disclosure provides an apparatus for evaluating insulation of a secondary battery, configured to apply AC voltage to a cell of the secondary battery, and to determine whether or not the corresponding cell is insulated through impedance acquired based on output signals in response to the applied AC voltage.

In another aspect, the present disclosure provides a method for operating an apparatus of evaluating insulation of a secondary battery, the method including connecting measurement probes of a measurement module to a cell of the secondary battery, applying, by the measurement module, AC voltage to the cell, analyzing, by a controller, output signals in response to the applied AC voltage, calculating impedance based on the analyzed output signals, and determining whether or not the cell is insulated based on the calculated impedance.

Other aspects and preferred embodiments of the disclosure are discussed infra.

BRIEF DESCRIPTION OF THE FIGURES

The above and other features of the present disclosure will now be described in detail with reference to certain exemplary embodiments thereof illustrated in the accompanying drawings which are given hereinbelow by way of illustration only, and thus are not limitative of the present disclosure, and wherein:

FIG. 1 is a cross-sectional view of a pouch-type battery cell;

FIG. 2A is a view showing the schematic layout of an insulation voltage test for pouch-type cells;

FIG. 2B is a view showing the schematic layout of an insulation resistance test for pouch-type cells;

Figure 2C:
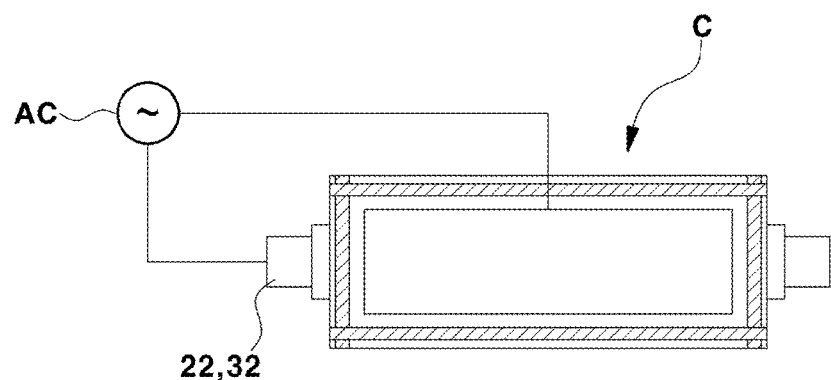
FIG. 2C is a view showing the schematic layout of insulation evaluation according to the present disclosure.

It should be understood that the appended drawings are not necessarily to scale, presenting a somewhat simplified representation of various preferred features illustrative of the basic principles of the disclosure. The specific design features of the present disclosure as disclosed herein, including, for example, specific dimensions, orientations, locations, and shapes, will be determined in part by the particular intended application and use environment.

In the figures, reference numbers refer to the same or equivalent parts of the present disclosure throughout the several figures of the drawing.

DETAILED DESCRIPTION

Specific structural or functional descriptions in embodiments of the present disclosure set forth in the description which follows will be exemplarily given to describe the embodiments of the present disclosure, and the present disclosure may be embodied in many alternative forms. Further, it will be understood that the present disclosure should not be construed as being limited to the embodiments set forth herein, and the embodiments of the present disclosure are provided only to completely disclose the disclosure and cover modifications, equivalents or alternatives which come within the scope and technical range of the disclosure.

In the following description of the embodiments, terms, such as "first" and "second", are used only to describe various elements, and these elements should not be construed as being limited by these terms. These terms are used only to distinguish one element from other elements. For example, a first element described hereinafter may be termed a second element, and similarly, a second element described hereinafter may be termed a first element, without departing from the scope of the disclosure.

When an element or layer is referred to as being "connected to" or "coupled to" another element or layer, it may be directly connected or coupled to the other element or layer, or intervening elements or layers may be present. In contrast, when an element or layer is referred to as being "directly connected to" or "directly coupled to" another element or layer, there may be no intervening elements or layers present. Other words used to describe relationships between elements should be interpreted in a like fashion, e.g., "between" versus "directly between," "adjacent" versus "directly adjacent," etc.

Wherever possible, the same reference numbers will be used throughout the drawings to refer to the same or like parts. The terminology used herein is for the purpose of describing particular embodiments only and is not intended to be limiting. As used herein, singular forms may be intended to include plural forms as well, unless the context clearly indicates otherwise. The terms "comprises," "comprising," "including," and "having" are inclusive and therefore specify the presence of stated features, integers, steps, operations, elements, components, and/or combinations thereof, but do not preclude the presence or addition of one or more other features, integers, steps, operations, elements, components, and/or combinations thereof.

As described above, insulation resistance and insulation voltage tests for secondary batteries are very important inspection items which are directly connected to safety of the secondary batteries.

Referring to FIGS. 2A and 2B, insulation voltage and insulation resistance measurements are performed as the conventional test method. At the stage of degassing during cell assembly, a perforated part 52 is formed by piercing a gas chamber 50 of a cell C. By applying a DC voltage through a probe 60, insulation voltage V between the perforated part 52 and a positive electrode tab 22 of a positive electrode 20 is measured. Insulation resistance R between the perforated part 52 and a negative electrode tab 32 of a negative electrode 30 is measured. After cell assembly has been completed, these insulation tests may be additionally performed. In case of insulation voltage, an error in a measured value may occur depending on a stored charge amount and. In case of insulation resistance, an error may occur depending on a measurement time, a measurement method, composition of equipment, etc.

In existing technologies, when the insulation resistance test and the insulation voltage test are performed, separate test apparatuses are individually required. Further, in existing methods, the case that the packing material 40 takes on the electric potential of the positive electrode 20 or the negative electrode 30 due to contact with the positive electrode tab 22 or the negative electrode tab 32, a liquid electrolyte permeates a damaged part of an inner insulating layer 46, and thus, detection is possible only when the electric potential is capable of being measured. That is, when the damaged part of the packing material 40 is infinitesimal and thus the liquid electrolyte does not come into contact with the damaged part, detection is impossible. As factors that influence insulation resistance in a battery cell, there are resistance of the inner insulating layer 46 and a charge storage capacity between the aluminum layer 44 and the positive electrode 20 or the negative electrode 30. However, using the existing measurement methods, it is difficult to separately detect the resistance value of the inner insulating layer 46 and the charge storage capacity value between the aluminum layer 44 and the positive electrode 20 or the negative electrode 30.

Accordingly, the present disclosure provides an apparatus and method for evaluating insulation of a secondary battery which may more precisely detect a damaged part by applying AC voltage, as shown in FIG. 2C.

According to the present disclosure, provided is an apparatus and method for evaluating insulation of a secondary battery which may integrate the voltage test apparatus and the resistance test apparatus, which were conventionally used to evaluate insulation, into one apparatus to achieve cost reduction and contribute to productivity improvement.

Further, the apparatus and method for evaluating insulation according to the present disclosure may be used not only in a jelly-roll state, during manufacture of a cell but also in a finished cell (including an aged cell), a module, a pack and a battery.

Hereinafter, the present disclosure will be described in detail with reference to the accompanying drawings.

Figure 3:
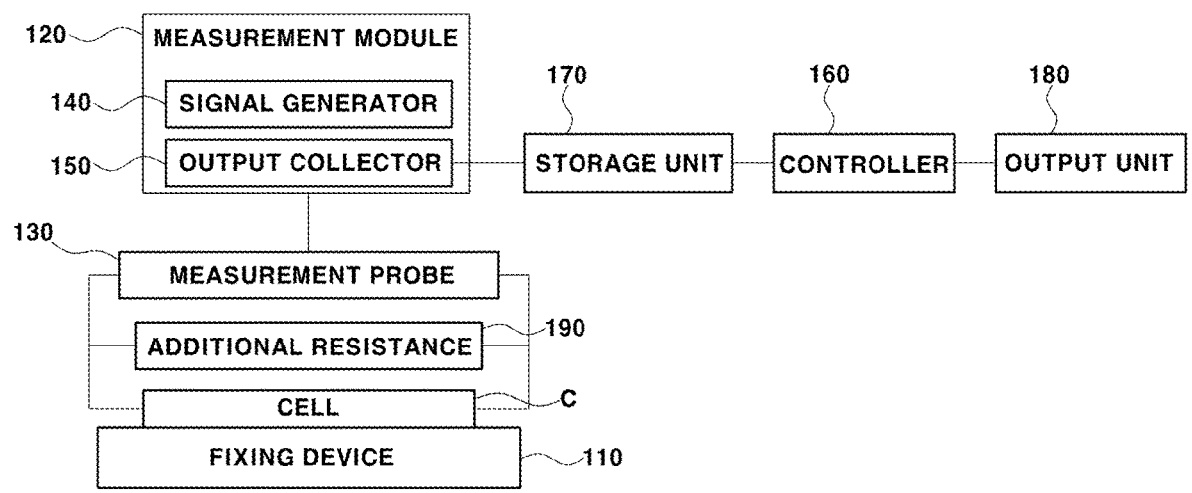
FIG. 3 is a block diagram of an apparatus for evaluating insulation according to the present disclosure.
Figure 4:
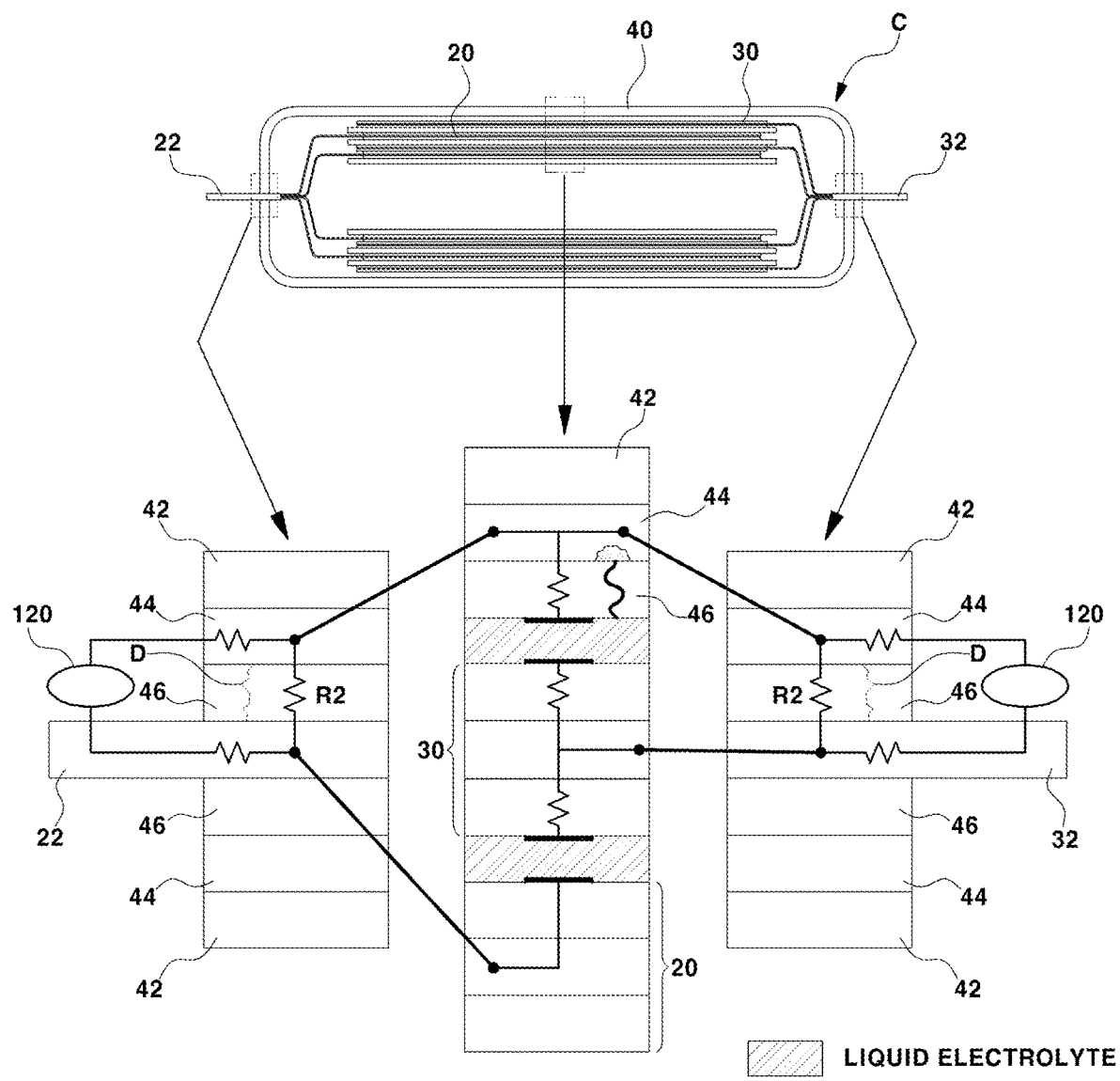
FIG. 4 is a cross-sectional view of a pouch-type cell for illustrating measurement of insulation of the pouch-type cell by the apparatus for evaluating insulation according to the present disclosure.

Referring to FIGS. 3 and 4, an apparatus for evaluating insulation of a secondary battery according to the present disclosure includes a fixing device 110, a measurement module 120, and a controller 160.

The fixing device 110 is configured such that a target to be tested, i.e., a cell C, is placed thereon to be fixed/secured. The fixing device 110 fixes the cell C not to be moved during the test, thereby being capable of minimizing an error during the test.

The measurement module 120 is configured to generate an input signal for determining insulation and to collect output signals which are responses of the cell C to the input signal. The measurement module 120 is configured to measure insulation between the aluminum layer 44 and the tab 22, 32 and whether the aluminum layer 44 is exposed to a liquid electrolyte.

According to an embodiment of the present disclosure, the measurement module 120 includes measurement probes 130, a signal generator 140, and an output collector 150.

The measurement module 120 is configured to be connected to the cell C. Concretely, the measurement probes 130 electrically connect the cell C to the measurement module 120. As one non-limiting example, the measurement probes 130 may be formed of conductive rubber, metal foam (metal fabric foam), or a metal.

According to an embodiment of the present disclosure, the measurement probes 130 may include at least two measurement probes 130. One of the at least two measurement probes 130 is connected to one of the positive electrode tab 22 and the negative electrode tab 32 of the battery cell C, and the other one of the at least two measurement probes 130 comes into contact with the aluminum layer 44 of the packing material 40. During manufacture of the cell C, the measurement probe 130 may come into contact with the aluminum layer 44 by piercing the gas chamber of the cell C, or the measurement probe 130 may come into contact with the aluminum layer 44 exposed from the end of the packing material 40, thereby being capable of performing measurement. Further, in the stage of a completed cell C, a battery module or a battery pack, the measurement probe 130 may come into contact with the aluminum layer 44 exposed from the end of each of respective cell C, thereby being capable of performing non-destructive testing.

The signal generator 140 generates AC voltage. The generated AC voltage is applied to the cell C. Particularly, the signal generator 140 may apply AC voltage, while changing a frequency from a high frequency value to a low frequency value. As one non-limiting example, AC voltage may be applied while reducing the frequency from 500 kHz to 100 mHz. As another non-limiting example, the amplitude of AC voltage may be changed from 1 mV to 500 mV. AC voltage may be applied while maintaining a designated voltage (for example, 2 to 5 V) by charging and discharging gaps between the packing material 40 and the positive electrode tab 22 or negative electrode tab 32. According to the present disclosure, whether the cell C is damaged is analyzed using electrical characteristics of AC. In AC, the amplitude and phase of current are changed depending on applied voltage. In this point of view, in the present disclosure, the internal electrical characteristics of the cell C may be easily detected by analyzing the cell C through an equivalent circuit.

The output collector 150 is configured to collect the responses of the cell C to the input AC voltage. Concretely, the output collector 150 measures changes in the amplitude and phase of the output signal from the cell C.

Measurement data collected by the output collector 150 is stored in a storage unit 170. In some examples of implementation, the storage unit 170 may be a data reservoir provided in the measurement module 120. In some other examples, the storage unit 170 may be a data reservoir provided separately from the measurement module 120. The storage unit 170 may be a non-volatile memory. Further, the storage unit 170 is configured to communicate with the controller 160, and the controller 160 is configured to access the measurement data stored in the storage unit 170. In some examples of implementation, the storage unit 170 may be included in the controller 160.

The controller 160 is configured to process the measurement data. Concretely, the controller 160 is configured to calculate resistance and capacitance and to calculate impedance by analyzing response characteristics of current to the applied AC voltage.

Further, the controller 160 visualizes the calculated impedance and provides visualized data. For example, calculated impedance may be visualized as a Bode plot or a Nyquist plot. The visualized data may be displayed on an output unit 180, such as a monitor. For example, when calculated impedance is visualized as a Bode plot or a Nyquist plot during frequency response analysis, a resistance component and a capacitance component may be easily distinguished in a specific frequency section, and reliability of results may be improved.

The amplitudes and phases of the resistance component of the cell C and the capacitance generated due to damage to the packing material 40 are changed at respective frequencies. When the electrical characteristics of the cell C are equivalently converted into a standard model, such as an electronic circuit, through impedance analysis, the electrical characteristics of the cell C may be easily detected. In the present disclosure, current flowing to the sealing part of the insulating layer of the packing material 40 and current stored between the packing material 40 and the electrodes 20, 30 at each frequency band may be separately analyzed.

The insulation resistance of the cell C includes the resistance of the insulating layer between the aluminum layer 44 of the packing material 40 and the electrode tabs 22, 32 and the charge storage capacity of the packing material 40. The current stored between the packing material 40 and the electrodes 20, 30 has the characteristics of a capacitor.

Hereinafter, a method for evaluating insulation according to the present disclosure will be described.

Figure 5A:
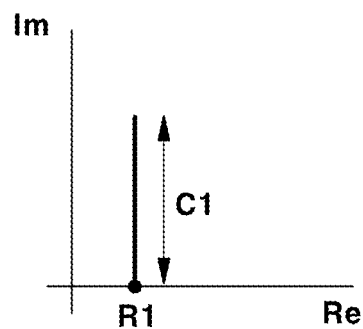
FIGS. 5A and 5B are a Nyquist plot and an equivalent circuit of a normal cell which is insulated, respectively.
Figure 6A:
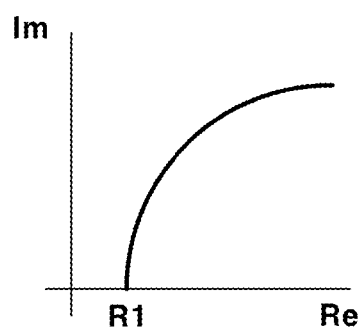
FIGS. 6A, 6B, and 6C are a Nyquist plot and equivalent circuits of a cell in which insulation between an electrode and an aluminum layer breaks down, respectively.

In order to evaluate insulation of the cell C, AC voltage is applied to the cell C by the measurement module 120 while changing a frequency from a high frequency value to a low frequency value. Then, among analyses of frequency responses, a Nyquist plot of the cell C is observed. FIGS. 5A and 6A illustrate Nyquist plots and, in these Nyquist plots, a horizontal axis represents the real component Re (Z') of impedance, and a vertical axis represents the imaginary component Im (−Z") of impedance.

As shown in FIG. 5A, in the Nyquist plot of a normal cell C, i.e., a normally insulated cell C, a graph is vertically raised along the −Z"-axis or the Im-axis, as the frequency decreases. As the insulated state of the cell C becomes better, the graph is vertically raised at a specific resistance value in the −Z"-axis direction or the Im-axis direction. That is, in the normal cell C, the phase angle of impendence substantially becomes 90° or comes close to 90°.

Figure 5B:
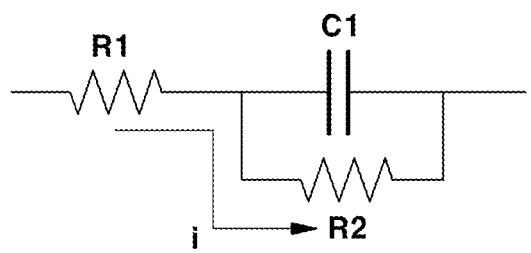

The equivalent circuit of the normally insulated circuit C may be schematized, as shown in FIG. 5b. That is, the equivalent circuit may include resistance R1 of measurement instruments, including the measurement probe 130, a contact part of the aluminum layer 44 of the packing material, etc., insulation resistance R2 between the aluminum layer 44 and the tabs 22 and 32, and the charge storage capacity C1 of the packing material 40.

On the contrary, in a cell C, insulation of which breaks down, i.e., in a cell C having a damaged packing material 40, as shown in FIG. 6A, a change in a graph is increased in the Z'-axis direction or the Re-axis direction due to a resistance component, and thereby, a Nyquist plot is drawn into a semicircular shape. Further, the phase angle of impedance is below 90°.

Figure 6B:
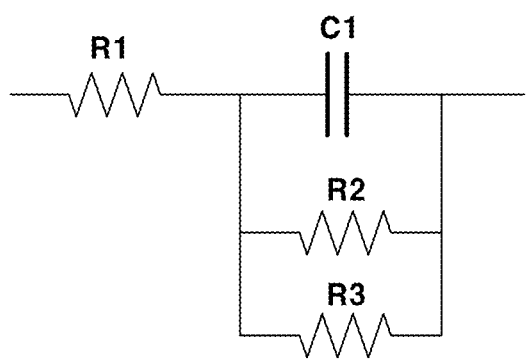
Figure 6C:
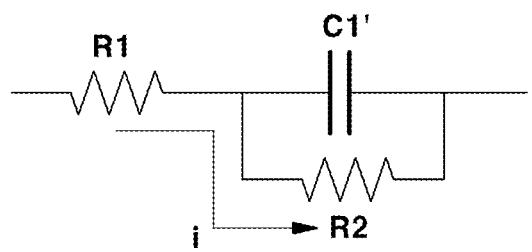

In the cell C in which insulation breaks down, current i flows to a cracked part of the inner insulating layer 46 of the packing material 40, which generates another resistance component R3 (with reference to FIG. 6B) or changes an original value of the storage capacity C1 into a different value C1' (with reference to FIG. 6C).

These insulation evaluation results may be expressed as the absolute value of impedance and the quantitative value of a phase angle at a specific frequency, not only insulation breakdown but also a degree of damage of the inner insulating layer 46 of the packing material or a type of progressive defect of gas generation may be distinguishable. Moreover, a measured resistance value is the same regardless of the number of measurements, the configuration of measurement equipment, etc.

Figure 7A:
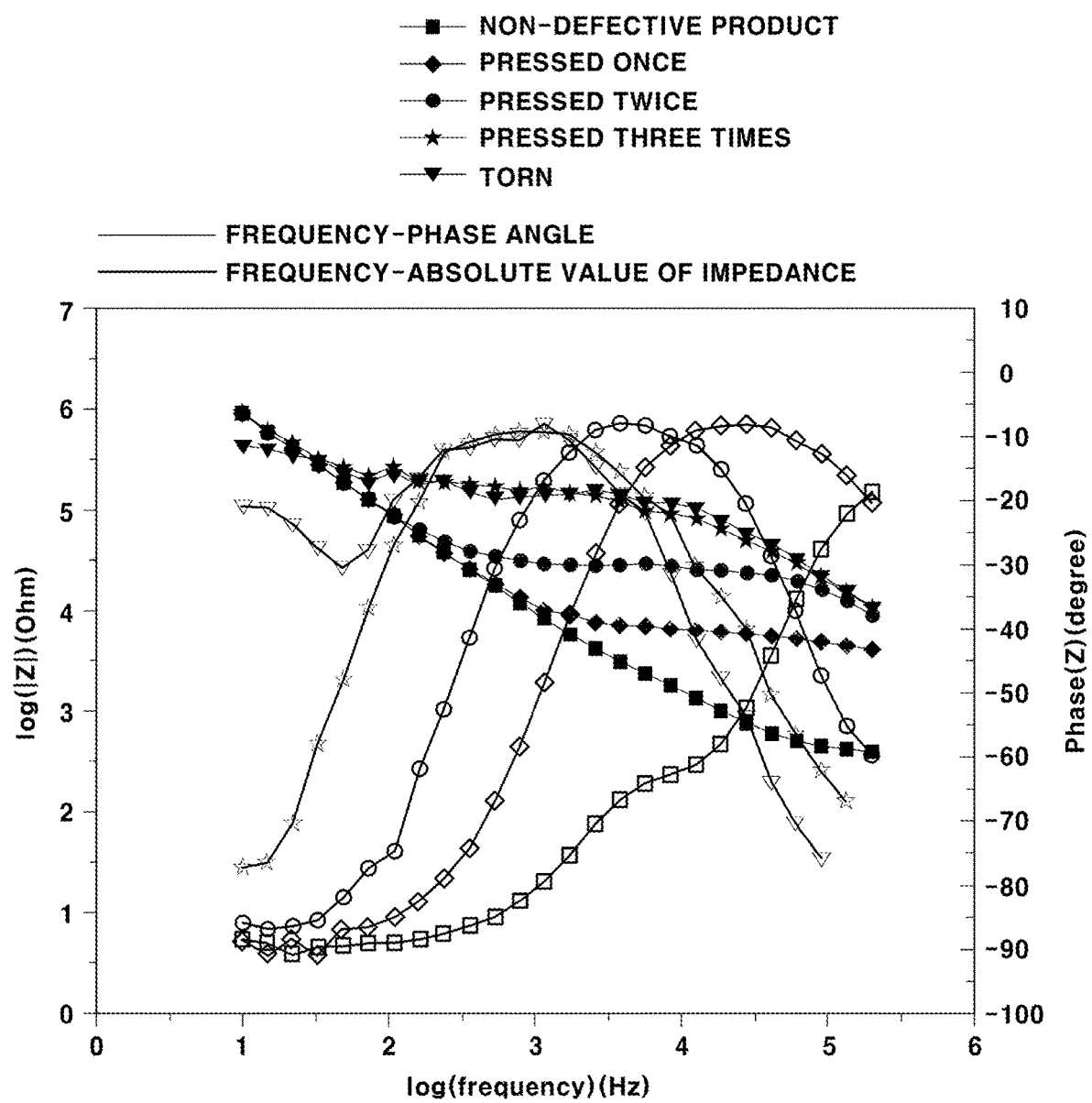
FIGS. 7A and 7B are Bode plots representing execution results of insulation evaluation according to the present disclosure with respect to cells including packing materials having different degrees of damage, respectively.
Figure 7B:
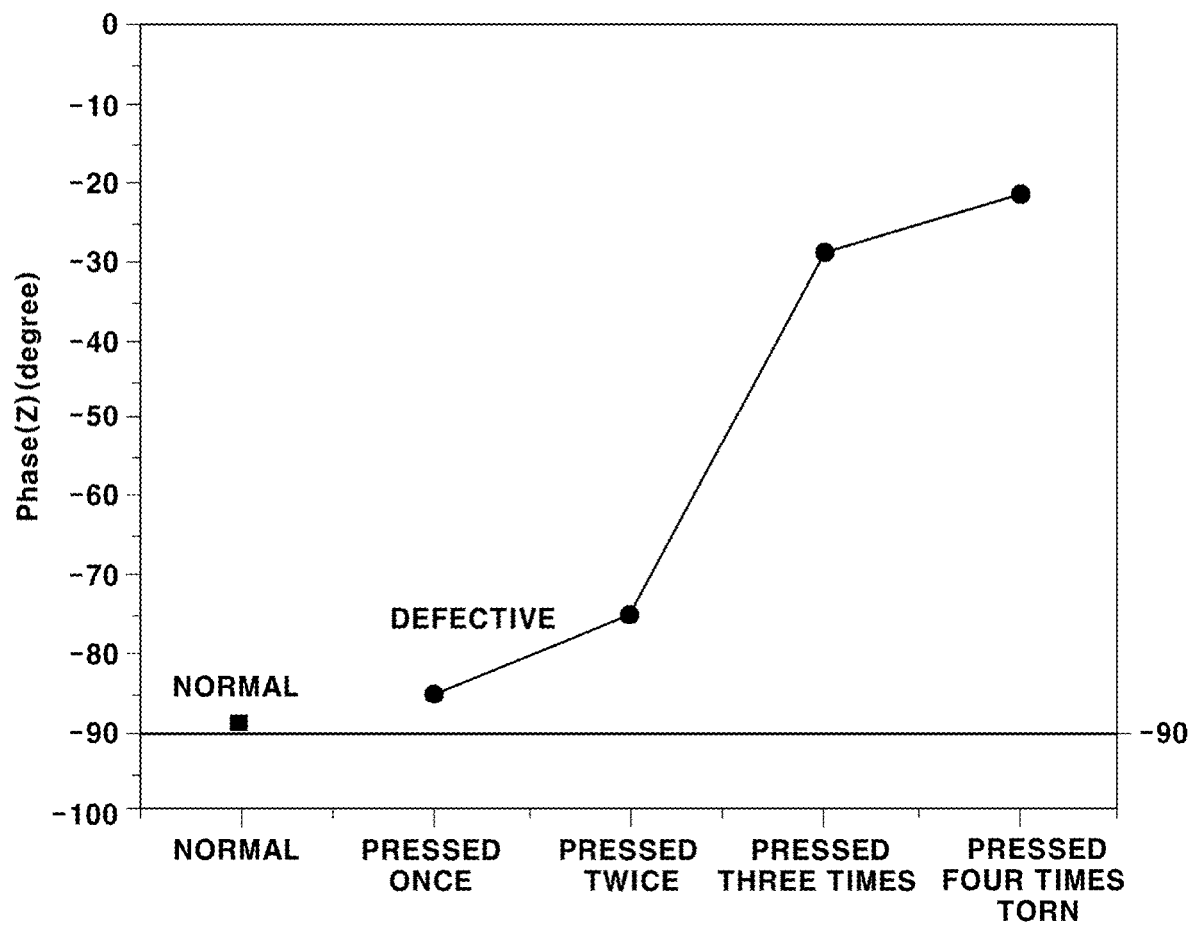
Figure 7C:
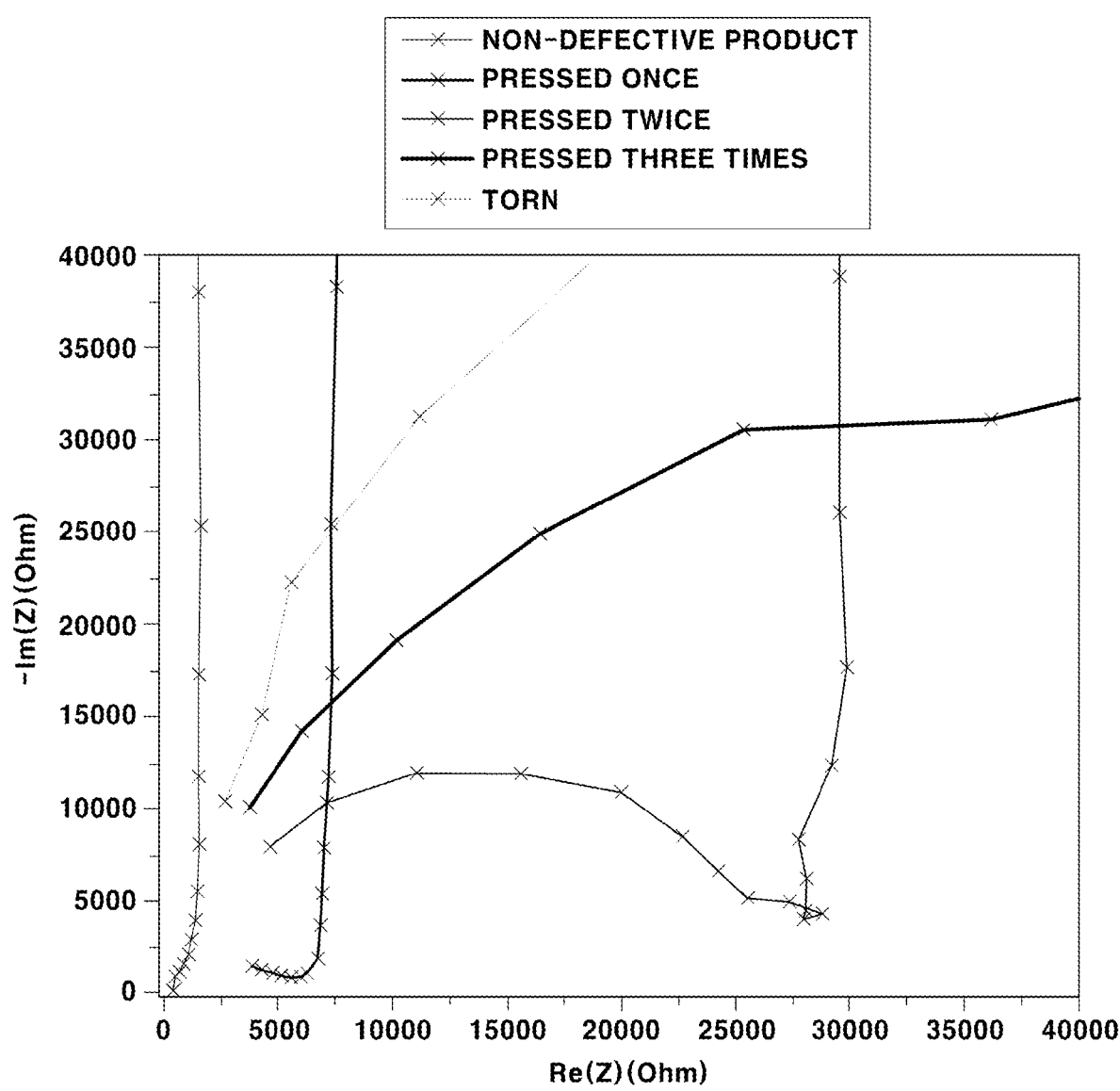
FIG. 7C is a Nyquist plot representing execution results of insulation evaluation according to the present disclosure with respect to the cells including the packing materials having the different degrees of damage.

For example, as shown in FIGS. 7A to 7C, as a degree of damage of the packing material 40 increases, the absolute value of impedance at a specific frequency within a measured frequency range increases. At the same time, the phase angle gradually decreases to below 90°. Respective values in Table 1 below are acquired from a Bode plot shown in FIG. 7A.

TABLE 1

|  | $|Z|$ | Phase angle |
| --- | --- | --- |
| Normal cell | 89.7 | −89.0 |
| Pressed once | 87.9 | −85.2 |
| Pressed twice | 90.7 | −75.1 |
| Pressed three times | 102.5 | −28.8 |
| Tearing of packing material | 223.3 | −21.4 |

Figure 8A:
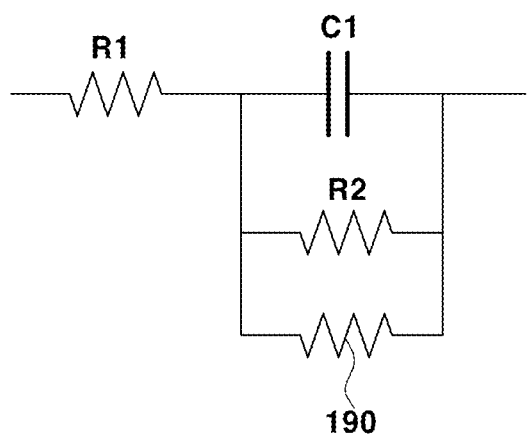
FIGS. 8A and 8B are an equivalent circuit and a Nyquist plot of a cell to which an additional resistance is connected, respectively.
Figure 8B:
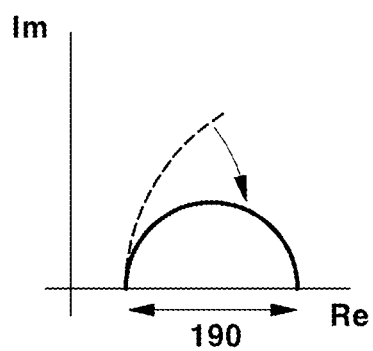

Further, according to the present disclosure, referring to FIGS. 8A and 8B, an additional resistance 190 may be provided. In order to secure more quantified data, a degree of short circuit of the packing material 40 may be quantified by connecting the additional resistance 190 to the cell C during measurement. The additional resistance 190 may be provided to be connected to the measurement probe 130 during the test. In the event of insulation breakdown, the intensity of a resistance component is changed depending on a degree of damage to the packing material 40, and the value of the additional resistance 190 is reduced by internal resistance generated in graphs.

According to the present disclosure, AC voltage is used in the event of insulation evaluation. In case of DC insulation voltage, voltage applied to a circuit while micro-current is generated by a high resistance element in a measuring instrument is measured. In this case, a voltage value is measured by the quantity of electric charge stored between the packing material and the electrodes. However, an error in measured values occurs depending on the quantity of stored electric charge. For example, in case the packing material is not damaged, when voltages of respective measurement parts are measured using DC voltage, the voltage of the positive electrode is measured as 3.7 V, and the voltage of the pouch-type cell is measured as 2.4 V. Therefore, a difference therebetween should be measured as 1.3 V, but when DC voltage is used insulation voltage tends to be measured as a value below 1.3 V in the insulated state.

Further, when a short circuit occurs between the positive electrode and the packing material or a short circuit occurs between the negative electrode and the packing material, a value of 0 V or about 3.55 V should be measured. In reality, such a correct value is not measured. There is a high possibility that this is because of an error occurring due to measurement of an electric capacity in the cell depending on a degree of the short circuit not due to measurement of an actual value. Therefore, when DC voltage is measured, the degree of the short circuit is not easily distinguishable, but, according to the present disclosure, an electric capacity component may be easily distinguished using AC voltage. DC insulation resistance is a value acquired by converting current flowing in the circuit after high voltage has been applied thereto, into resistance, and the sum of current flowing along the insulating layer and current stored between the packing material and the electrodes is measured. Therefore, in case of DC insulation resistance, it may be difficult to distinguish effects of two currents, and an error may occur depending on a measurement time, a measurement method and/or the configuration of measurement equipment.

Figure 9:
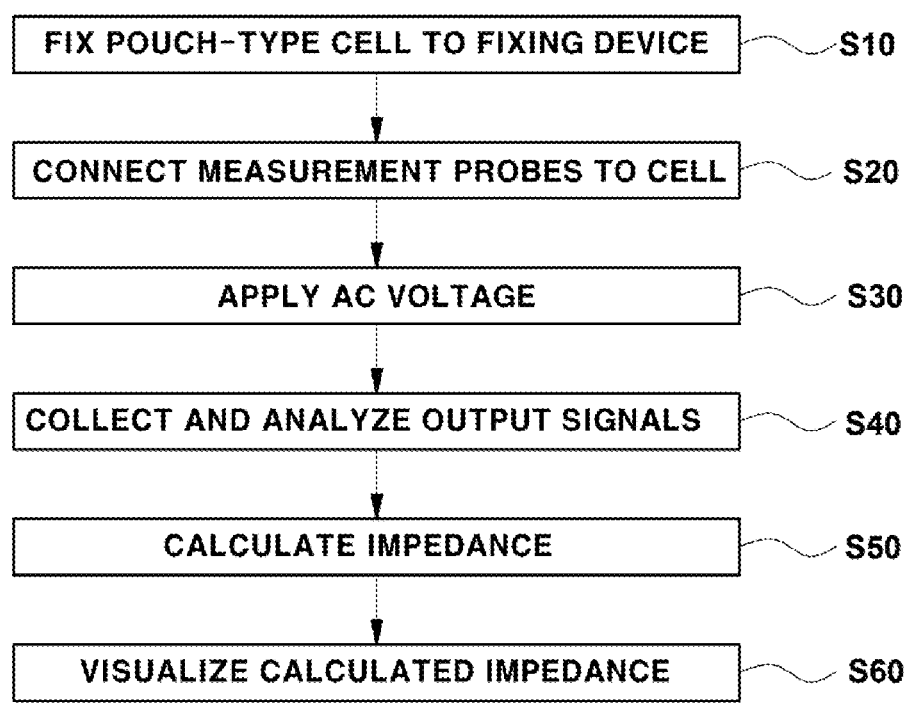
FIG. 9 is a flowchart representing a method for evaluating insulation according to the present disclosure.

FIG. 9 is a flowchart representing a method for evaluating insulation according to the present disclosure.

First, the cell C, which is a target to be tested, is placed on the fixing device 110. The cell C is firmly fixed using fastening members provided in the fixing device 110 at S10.

Thereafter, the measurement probes 130 of the measurement module 120 are connected to the aluminum layer 44 and either positive electrode tab 22 or the negative electrode tab 32, respectively at S20. As described above, the measurement probes 130 may come into contact with the aluminum layer 44 by piercing the gas chamber, or may come into contact with the aluminum layer 44 exposed from the end of the packing material 40.

Thereafter, the signal generator 140 of the measurement module 120 applies AC voltage to the cell C connected to the measurement module 120 at S30. Here, AC voltage is applied to the cell C while changing a frequency from a high frequency value to a low frequency value.

Thereafter, the measurement module 120 collects output signals in response to the applied AC voltage. The controller 160 analyzes the output signals at S40.

The controller 160 calculates impedance based on the output signals at S50, visualizes the calculated impedance as a Bode plot, a Nyquist plot, etc. at S60. The controller 160 provides these plots to a user through the output unit 180. That is, as results of frequency response analysis, when the phase angle of the impedance is close to 90° as the frequency is changed from the high frequency value to the low frequency value, the corresponding cell C may be determined as a normal cell. On the contrary, when the phase angle of the impedance converges onto a value below 90°, e.g., any value between 0 to 85°, as the frequency is changed from the high frequency value to the low frequency value, the corresponding cell C may be determined as a cell in which insulation breaks down.

As described above, among battery cells, a pouch-type cell is described as one example, but the apparatus for evaluating insulation according to the present disclosure may be applied not only to pouch-type cells but also to prismatic-type cells, and cylindrical-type cells.

The apparatus for evaluating insulation according to the present disclosure secures data as impedance using AC voltage, thereby being capable of increasing reliability of a resistance value.

The apparatus for evaluating insulation according to the present disclosure may integrate the conventional insulation voltage and insulation resistance measurement apparatuses into one unit, thereby being capable of reducing costs and improving productivity.

In the present disclosure, since a non-destructive testing method is used, data may be measured immediately after assembly of a secondary battery or after use of the secondary battery for a certain period of time.

As is apparent from the above description, the present disclosure may provide an apparatus for evaluating insulation of a secondary battery which has improved measurement reliability using AC voltage.

Further, the present disclosure may provide an apparatus for evaluating insulation of a secondary battery which may simplify the conventional inspection apparatuses so as to reduce costs and to improve productivity.

The disclosure has been described in detail with reference to preferred embodiments thereof. However, it will be appreciated by those skilled in the art that changes may be made in these embodiments without departing from the principles and spirit of the disclosure, the scope of which is defined in the appended claims and their equivalents.

The invention claimed is:

1. An apparatus for evaluating insulation of a secondary battery, wherein the apparatus is configured to apply AC voltage to a cell of the secondary battery, and to determine whether the cell is insulated through impedance obtained based on output signals in response to the applied AC voltage;
   wherein the cell comprises:
      a packing material;
      a positive electrode and a negative electrode stacked to be separated from each other by separators and sealed in the packing material; and
      a liquid electrolyte filled and sealed in the packing material,
   wherein the apparatus comprises a measurement module, wherein the measurement module comprises:
      a pair of probes electrically connected to the cell;
      a signal generator configured to generate the AC voltage applied to the cell; and
      an output collector configured to collect the output signals in response to the applied AC voltage, and
   wherein a first of the pair of the probes is connected to the packing material, and a second of the pair of the probes is connected to a tab of either the positive electrode or the negative electrode, wherein a designated voltage is maintained in the packing material and the tab by charging and discharging therebetween during application of the AC voltage.

2. The apparatus of claim 1, wherein the apparatus is configured to evaluate whether insulation between the inside of the packing material and an outside breaks down through the packing material.

3. The apparatus of claim 2, wherein the packing material comprises:
   an outer insulating layer configured to come into contact with an outside of the cell;
   an inner insulating layer configured to come into contact with an inside of the cell; and
   an aluminum layer interposed between the outer insulating layer and the inner insulating layer.

4. The apparatus of claim 1, further comprising a controller configured to determine whether the cell is insulated by analyzing the output signals in response to the applied AC voltage.

5. The apparatus of claim 4, wherein the controller is configured to calculate an electric capacity and resistance of the cell from the impedance and to determine whether the cell is insulated based on the calculated electric capacity and resistance.

6. The apparatus of claim 1, further comprising an additional resistance,
   wherein the pair of probes is connected to each end of the additional resistance.

7. The apparatus of claim 1, further comprising a fixing device configured to secure the cell.

8. The apparatus of claim 1, wherein the cell is any one of a pouch-type cell, a prismatic-type cell and a cylindrical-type cell.

9. A method for operating an apparatus of evaluating insulation of a secondary battery, the method comprising:
   connecting a plurality of measurement probes of a measurement module to a cell of the secondary battery, wherein the plurality of measurement probes are connected to an aluminum layer of a packing material of the cell and one electrode tab of the cell;
   applying, by the measurement module, an AC voltage to the cell, wherein a designated voltage is maintained in the packing material and the one electrode tab by charging and discharging therebetween during application of the AC voltage;
   analyzing, by a controller, an output signal in response to the applied AC voltage;
   calculating an impedance based on the analyzed output signal; and
   determining whether the cell is insulated based on the calculated impedance.

10. The method of claim 9, further comprising:
    securing the cell to a fixing device before connecting of the measurement probes to the cell.

11. The method of claim 9, further comprising:
    visualizing the calculated impedance,
    wherein, in the visualizing the calculated impedance, a Nyquist plot or a Bode plot using the calculated impedance is provided.

12. The method of claim 9, wherein, in applying of the AC voltage to the cell, the AC voltage is applied to the cell while reducing a frequency from a high frequency value to a low frequency value within a predetermined frequency range.

13. The method of claim 12, wherein, in determining of whether the cell is insulated, when a phase angle of the calculated impedance is close to 90° as the frequency is reduced to the low frequency value within the predetermined frequency range, the cell is determined as a normal cell.

14. The method of claim 12, wherein, in determining of whether the cell is insulated, when a phase angle of the calculated impedance converges onto a value below 90° as the frequency is reduced to the low frequency value within the predetermined frequency range, the cell is determined as a cell in which insulation breaks down.

15. The method of claim 9, wherein the cell is any one of a pouch-type cell, a prismatic-type cell and a cylindrical-type cell.

* * * * *